United States Patent
Nishikawa et al.

(10) Patent No.: US 7,135,736 B2
(45) Date of Patent: Nov. 14, 2006

(54) SEMICONDUCTOR DEVICE

(75) Inventors: Takashi Nishikawa, Nara (JP); Takashi Ohtsuka, Toyonaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/616,917

(22) Filed: Jul. 11, 2003

(65) Prior Publication Data

US 2004/0036111 A1   Feb. 26, 2004

Related U.S. Application Data

(63) Continuation of application No. PCT/JP03/03493, filed on Mar. 24, 2003.

(30) Foreign Application Priority Data

Mar. 26, 2002  (JP) .............................. 2002-085284

(51) Int. Cl.
*H01L 29/788*   (2006.01)
(52) U.S. Cl. ..................... 257/316; 257/315; 257/317
(58) Field of Classification Search ................. 257/316, 257/315, 317, 314, 411, 321
See application file for complete search history.

(56) References Cited

U.S. PATENT DOCUMENTS

| | | | |
|---|---|---|---|
| 6,013,553 A | 1/2000 | Wallace et al. | |
| 6,048,766 A * | 4/2000 | Gardner et al. | 438/257 |
| 6,407,435 B1 | 6/2002 | Ma et al. | |
| 6,674,109 B1 * | 1/2004 | Fujimori et al. | 257/295 |
| 6,674,138 B1 * | 1/2004 | Halliyal et al. | 257/411 |
| 2001/0028582 A1 | 10/2001 | Tarul et al. | |
| 2001/0045595 A1 | 11/2001 | Black et al. | |
| 2003/0034548 A1 | 2/2003 | Hayashi et al. | |

FOREIGN PATENT DOCUMENTS

| | | |
|---|---|---|
| CN | 1090428 | 8/1994 |
| CN | 1211827 | 3/1999 |
| CN | 1338113 | 2/2002 |
| EP | 1124262 | 8/2001 |
| JP | 06-204404 | 7/1994 |
| JP | 11-168069 | 6/1999 |
| JP | 11-168096 | 6/1999 |
| JP | P2002-313966 | 10/2002 |

* cited by examiner

OTHER PUBLICATIONS

Mitsue Takahashi et al., "Analysis and Improvement of Retention Time of Memorized State of Metal-Ferroelectric-Insulator-Semiconductor Structure for Ferroelectric Gate FET Memory". The Japan Society of Applied Physics, Jan. 5, 2001, pp. 2923-2927.

*Primary Examiner*—Zandra V. Smith
*Assistant Examiner*—Kiesha Rose
(74) *Attorney, Agent, or Firm*—McDermott Will & Emery LLP (57) ABSTRACT

This specification relates to a semiconductor device that comprises a semiconductor substrate 11, a source region 12 and a drain region 13, which are formed on the semiconductor substrate 11 with a channel region 14 therebetween; a floating gate electrode 152 that is formed on the channel region 14 with a gate insulator film 151 therebetween; a ferroelectric film 154 that is formed on the floating gate electrode 152; and a control gate electrode 156 that is formed on the ferroelectric film 154, wherein intermediate insulator films 153 and 155 are formed between at least one of the pairs consisting of the floating gate electrode 152 and the ferroelectric film 154, and the ferroelectric film 154 and the control gate electrode 156, and the intermediate insulator films 153 and 155 are made of hafnium oxide that contains nitrogen atoms.

8 Claims, 9 Drawing Sheets

SEMICONDUCTOR DEVICE

This application is a Continuation of International Application No. PCT/JP03/03493, filed on Mar. 24, 2003.

TECHNICAL FIELD

The present invention relates to a semiconductor device in which a gate electrode structure having a floating gate electrode and a ferroelectric film is deposited on a semiconductor substrate.

BACKGROUND ART

Heretofore, the nonvolatility of recorded information, i.e., the state in which recorded information is retained even if the power supply is turned off, has been achieved by using a magnetic tape drive, a hard disc drive, an optical disc drive, a magneto-optical disc drive, or the like. On the contrary, in recent years, experiments have been actively conducted in which nonvolatility is achieved by using a semiconductor-based solid-state component. Among these, for example, flash memory, FeRAM, and the like have already been put to practical use. These memory devices do not contain any movable machine parts, such as those needed in a magnetic tape drive and the like, and are smaller in size and consume lower amounts of electric power, making them excellent candidates as practical memory device.

A flash memory is summarized in the first document, Hitoshi KUME, "Flash memory technology," *Applied physics*, Vol. 65, No. 11, (1996): pp. 1114 to 1124. An FeRAM is summarized in the second document, Elliott M. Philofsky, "FeRAM The Ultimate Memory," *The Journal of The Institute of Electronics, Information and Communication Engineers*, Vol. 80, No. 2, (1997), pp. 169 to 175.

However, flash memory devices and FeRAMs have the following problems.

The currently used flash memory devices need a high operating voltage, and, according to the first document, the maximum internal voltage thereof is 12 V. This is extremely high compared to the operating voltage of general DRAMs and LSIs, which can be-operated by a voltage of 3 to 4 V. In addition to this problem, the currently used flash memory devices take 1 millisecond to 1 second to rewrite data. This is very troublesome for users, when it is necessary to frequently rewrite data.

According to the second document, FeRAMs have an internal voltage that is not more than 5 V, which is lower than that of a flash memory. The access time thereof is as short as 250 nanoseconds. However, FeRAMs have a drawback in that the switching properties of the ferroelectric capacitor are susceptible to temperature changes. Furthermore, although high-temperature annealing is necessary to fabricate an FeRAM, the ferroelectric layer thereof contains Pb, Bi, and like metals with low melting points as constituent components, and these elements are therefore diffused into the substrate.

Because of these problems, in recent years, research and development relating to nonvolatile recording devices that are collectively called "MFS transistors" and that differ from flash memory and FeRAM devices has been actively conducted. MFS transistor technology is summarized, for example, in the third document, Yasuo TARUI, "Trend of development and future of ferroelectric memories," *The Journal of The Institute of Electronics, Information and Communication Engineers*, Vol. 77, No. 9, pp. 976 to 979. In this device, a ferroelectric is arranged in the gate electrode of an ordinary MOS transistor, wherein a nonvolatile memory is obtained by varying the channel conductance in the transistor by changing the polarization direction of the ferroelectric.

Such an MFS transistor employs the following structure. Ordinarily, it is difficult to dispose a ferroelectric directly onto an Si substrate because problems arise such as the diffusion of elements, etc. Therefore, in most cases, an MFIS structure, in which an insulator film (insulator) that also serves as a diffusion prevention layer is inserted between the Si substrate and the ferroelectric film, or an MFMIS structure, in which a floating gate electrode is further incorporated therein, is employed.

However, transistors having the MFMIS structure, in fact, also pose several problems. For example, when the ferroelectric film is switched by applying voltage to the gate, even after the voltage is removed, a depolarization field that is generated by polarization still exists in the ferroelectric film. Therefore, the ferroelectric film is constantly subjected to a force in the direction in which the stored polarization is cancelled, and this makes it difficult to stably maintain polarization. Furthermore, due to this depolarization field, current gradually flows from the semiconductor substrate or a controlling gate electrode disposed on the semiconductor substrate to the floating gate electrode and ferroelectric film. The current that flows thereto will gradually compensate the charge of the floating gate electrode that is generated by the polarization of the ferroelectric film, finally resulting in the loss of stored information. In other words, information will become undesirably volatile and this prevents the transistor from serving as a nonvolatile memory device.

The duration of time that a nonvolatile memory device can retain information is referred to as retention time. If information volatilizes as described above, it becomes impossible to achieve a satisfactory retention time. Note that the average retention time guaranteed in flash memory devices is currently $3 \times 10^8$ seconds, which corresponds to 10 years.

With this drawback in view, several experiments relating to MFMIS transistors have been conducted in order to prolong the retention time thereof by controlling the leakage current. For example, the fourth document, "M. Takahashi et al., *Jpn., J. Appl. Phys.*, Vol. 10 (2001), pp. 2923 to 2927" reports a calculation that the retention time can be prolonged to $1 \times 10^{12}$ seconds by structuring an MFMIS in such a manner that the insulator film is inserted between the control gate electrode and the ferroelectric film of the MFMIS transistor. Alternatively, an MIFIMIS structure is proposed in which an insulator film is also inserted between the floating gate electrode and the ferroelectric film to reduce the leakage current.

In MOS transistors, in order to prevent leakage current, instead of the insulator film made of silicon dioxide, tetranitrogen trioxide, silicon nitride/oxide, or the like that has heretofore been arranged between the gate electrode and the semiconductor substrate, the use of an insulator film made of a material that has a higher dielectric constant is being considered. Such an insulator film having a high dielectric constant is generally called a "high-dielectric-constant film" or a "high-k film." The use of such a film increases the physical thickness of the insulator film, preventing the leakage of current. Examples of excellent candidates for materials for the insulator film include $ZrO_2$, $Al_2O_3$, $La_2O_3$, $PrO_3$, $Gd_2O_3$, $Y_2O_3$, etc.

Similarly, hafnium dioxide ($HfO_2$) and like hafnium oxides, hafnium silicon oxides ($HfSiO_x$), hafnium silicate aluminates (HfSiAlO$_x$), hafnium nitride oxide (HfON), and the like are also excellent candidates.

Hence, introducing the high-k films used in MOS transistors also into MIFIMIS transistors in order to control leakage current is being considered. Hereunder, the properties of the insulator film required in MOS transistors and MIFIMIS transistors will be explained.

Figure 11:
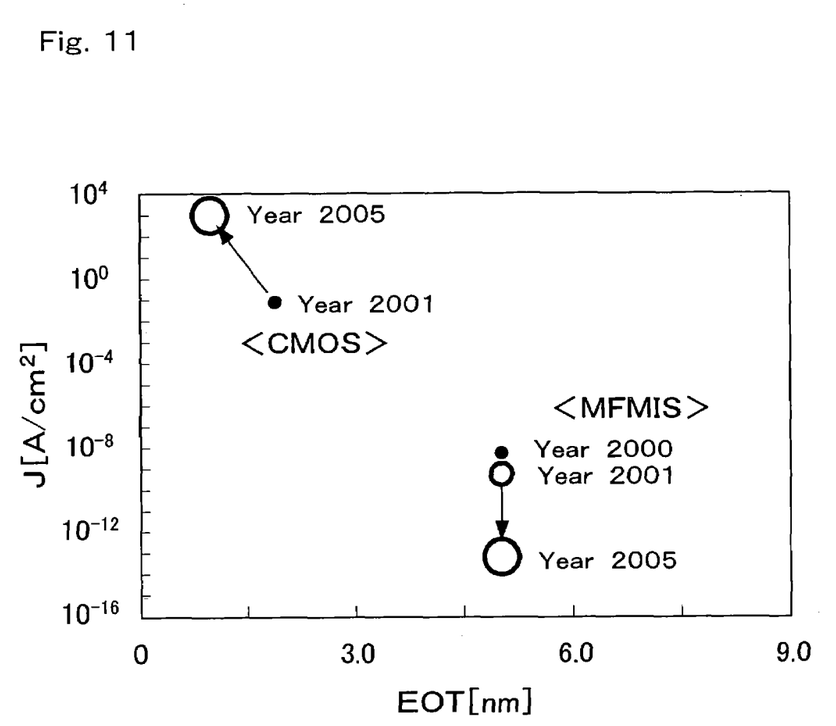
FIG. 11 shows the relationship between the EOT and the leakage current density that is required in MOS transistors and MIFIMIS transistors.

FIG. 11 shows the figure of merit required in MOS transistors and MFMIS transistors. In other words, it shows the relationship between SiO$_2$ equivalent film thickness (EOT: equivalent oxide thickness) and leakage current density (J). According to this figure, in MOS transistors, the EOT in the year 2001 was 1.6 nm and it is expected to decrease to 0.8 nm by the year 2005. This is because, in MOS transistors, a higher capacitance will be needed since the area of the gate will decrease as devices are further miniaturized, and therefore the insulator film should be made extremely thin. However, this increases leakage current density, i.e., from 0.1 A/cm$^2$ to $1\times10^3$ A/cm$^2$.

In the MFMIS transistor, however, its performance as a nonvolatile device is the most important. The leakage current density thereof was $1\times10^{-8}$ A/cm$^2$ in the year 2001 and it should be $1\times10^{-13}$ A/cm$^2$ by the year 2005 in order to retain stored information. On the other hand, although the thinner EOT is better, from the viewpoint of a nonvolatile device, 5 nm will be satisfactory in the year 2005.

As described above, heretofore used MOS transistors and MFMIS transistors have quite different requirements for the insulator film performance. Therefore, it is insufficient to apply high-k films, whose introduction is being considered in MOS transistors, to MFMIS transistors to obtain an MIFIMIS structure.

The present invention aims to solve the above problems and to provide a semiconductor device in which the amount of leakage current can be decreased in an MIFIMIS and like structures wherein an MFMIS structure is provided with an insulator film, and a fabrication method thereof.

DISCLOSURE OF THE INVENTION

In order to solve the above problems, a semiconductor device according to the first invention comprises a semiconductor substrate; a source region and a drain region, which are formed on the semiconductor substrate with a channel region therebetween; a floating gate electrode that is formed on the channel region with a gate insulator film therebetween; a ferroelectric film that is formed on the floating gate electrode; and a control gate electrode that is formed on the ferroelectric film; wherein an intermediate insulator film is formed between at least one of the pairs consisting of the floating gate electrode and the ferroelectric film, and the ferroelectric film and the control gate electrode; and the intermediate insulator film is made of a hafnium oxide that contains nitrogen atoms.

A method for fabricating a semiconductor device according to the second invention comprises the steps of forming a floating gate electrode on a semiconductor substrate with a gate insulator film therebetween; forming a ferroelectric film on the floating gate electrode; forming a control gate electrode on the ferroelectric film; and forming a source region and a drain region on the semiconductor substrate; which further comprises the step of: forming an intermediate insulator film between at least one of the pairs consisting of the floating gate electrode and the ferroelectric film, and the ferroelectric film and the floating gate electrode; wherein the intermediate insulator film is formed by using hafnium or compounds thereof as a target, and sputtering while introducing a gas that contains argon, oxygen, and nitrogen into a film-formation space.

A method for fabricating a semiconductor device according to the third invention comprises the steps of forming a floating gate electrode on a semiconductor substrate with a gate insulator film therebetween; forming a ferroelectric film on the floating gate electrode; forming a control gate electrode on the ferroelectric film; and forming a source region and a drain region on the semiconductor substrate; which further comprises the step of: forming an intermediate insulator film between at least one of the pairs consisting of the floating gate electrode and the ferroelectric film, and the ferroelectric film and the floating gate electrode; wherein the intermediate insulator film is formed by MOCVD using a gas made of organic metal compounds that contain hafnium, a gas containing oxygen atoms, and a gas containing nitrogen atoms, as a source gas.

Furthermore, a method for fabricating a semiconductor device according to the fourth invention comprises the steps of forming a floating gate electrode on a semiconductor substrate with a gate insulator film therebetween; forming a ferroelectric film on the floating gate electrode; forming a control gate electrode on the ferroelectric film; and forming a source region and a drain region on the semiconductor substrate; which further comprises the step of: forming an intermediate insulator film between at least one of the pairs consisting of the floating gate electrode and the ferroelectric film, and the ferroelectric film and the floating gate electrode; wherein the intermediate insulator film is formed by ALD using a gas that contains HfCl$_4$ gas, H$_2$O gas, and nitrogen atoms as a source gas.

BEST MODE FOR CARRYING OUT THE INVENTION (1. Semiconductor Device)

Figure 1:
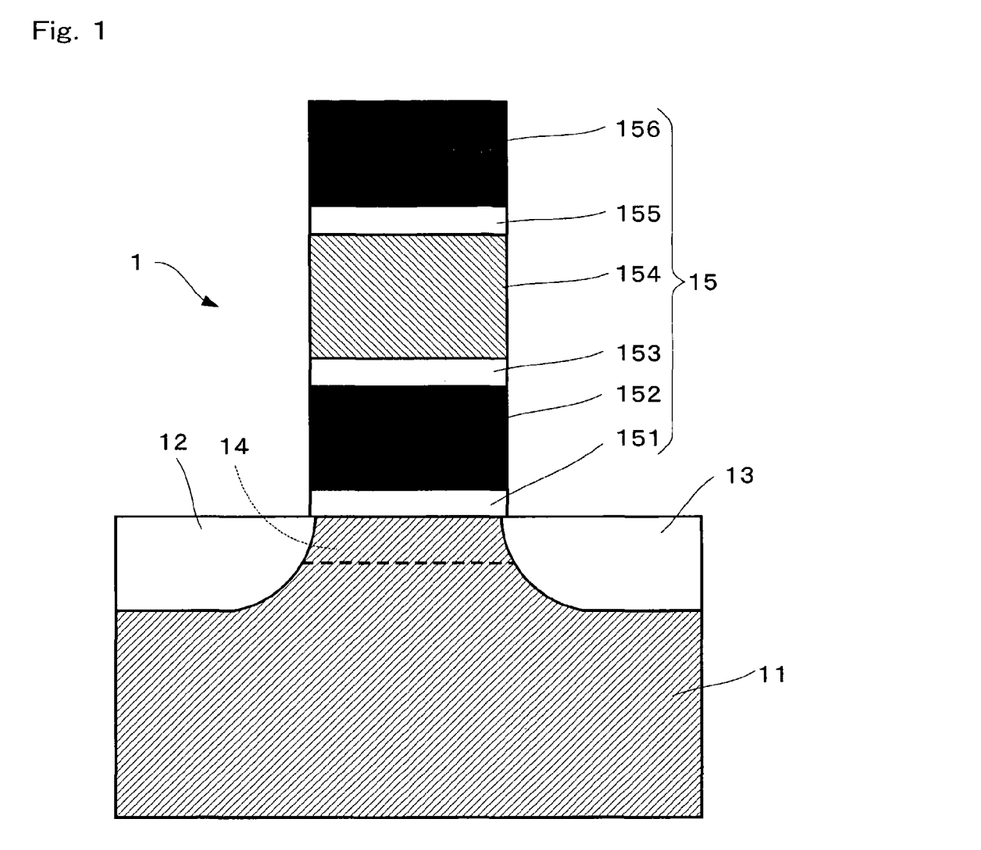
FIG. 1 is a cross-sectional view showing a semiconductor device according to one embodiment of the present invention.

Hereunder, a semiconductor device according to one embodiment of the present invention will be explained. As shown in FIG. 1, the semiconductor device 1 comprises a semiconductor substrate 11, and a source region 12 and drain region 13, which are formed in the semiconductor substrate 11. On a channel region 14 that is formed between the source region 12 and the drain region 13, a gate electrode structure 15 is formed.

The semiconductor substrate 11 is an Si semiconductor substrate that contains p-type or n-type impurities, and generally has a resistivity not lower than 0.1 Ocm and not higher than 50 Ocm. Furthermore, the source region 12 and the drain region 13 are structured so as to have a different conductive type from that of the semiconductor substrate 11.

The gate electrode structure 15 is configured as follows. A floating gate electrode 152 is formed on the channel region 14 with a gate insulator film 151 therebetween. On the floating gate electrode 152, a ferroelectric film 154 is formed with a first intermediate insulator film 153 therebetween. On the ferroelectric film 154, a second intermediate insulator film 155 is formed with a control gate electrode 156 therebetween.

The floating gate electrode 152 is formed of an electrically conductive thin film that is made of platinum (Pt), ruthenium (Ru), iridium (Ir), or oxides thereof, etc., and serves to store a charge that is induced by the ferroelectric film 154. Note that the floating gate electrode 152 can be made of materials other than these, and, the same as with ordinary MOS transistors, it is possible to use polysilicon or silicides of various metals for use in metal gates, such as WSi, PtSi, etc. It is also possible to combine a number of them and form a multi-layered structure.

It is preferable that the ferroelectric film 154 be formed of materials that have small ferroelectric parameter values, such as those for electric coercive field (Ec), residual dielectric polarization (Pr), etc., and a small amount of leakage current, as well as a high thermal stability and anti-reducing property. For example, $Bi_4Ti_3O_{12}$ (BIT), $SrBi_2Ta_2O_9$ (SBT), Pb (Zr, Ti)$O_3$(PZT), and the like can be used.

The control gate electrode 156 can be made of the same materials as those of MOS transistors, including, for example, polysilicon, aluminum (Al), etc. Alternatively, platinum (Pt), ruthenium (Ru), iridium (Ir), and conductive oxides thereof can be used.

The gate insulator film 151 and the intermediate insulator films 153 and 155 are formed of a hafnium oxide that contains nitrogen atoms, for example, nitrogen-added hafnium dioxide ($HfO_2$:N) or hafnium oxide/nitride (HfON). In this specification, $HfO_2$:N means hafnium dioxide that contains an amount of nitrogen appropriate for doping, and HfON means hafnium that chemically combines not only with oxygen but also with nitrogen.

The atomic percent of nitrogen in the insulator films 151, 153, and 155 is selected in the following manner.

The use of HfO:N or HfON in a gate insulator film of an MOS transistor as a high-k film has already been considered. However, the amount of nitrogen to be added has not been clarified. This is because, the properties required in an insulator film for use in an MOS transistor are diverse, including interface state density, fixed charge density within the film, dielectric constant (or equivalent film thickness), amount of leakage current, break down voltage, reliability, etc., and the evaluation of each parameter is not yet completed. In addition, gate insulator films used in MOS transistors are very thin, having a thickness of several nm or less, making it impossible to measure the content of nitrogen accurately enough to be able to relate it to each parameter. Another reason is that the electrical characteristics relating to the structure of the MOS transistor are mainly evaluated, and the film itself has not yet been satisfactorily evaluated.

On the contrary, the physical thickness of an insulator film used in a semiconductor device of the present invention is as much as 10 nm or more, and the parameters relating to the leakage current density are primarily evaluated, making it possible to systematically evaluate the relationship between the content of nitrogen and the leakage current density. Hereunder, the desirable nitrogen content will be explained.

Figure 2:
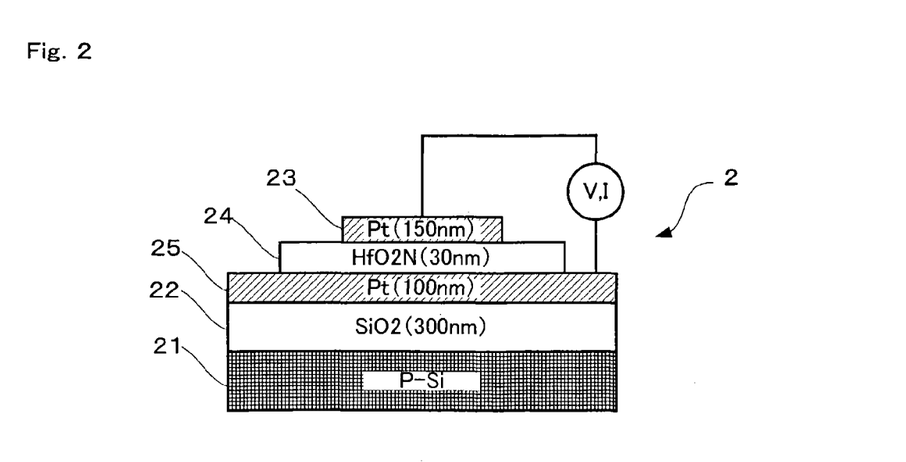
FIG. 2 is a schematic diagram showing a device for measuring leakage current density.
Figure 3:
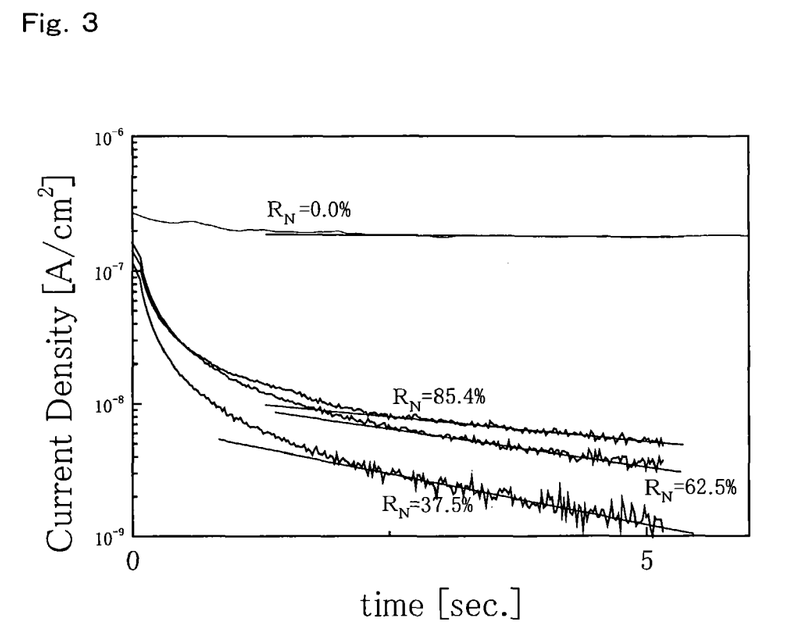
FIG. 3 shows the relationship between the nitrogen flow rate and leakage current density.

FIG. 2 is a schematic diagram that shows a device for measuring leakage current density. The device 2 is structured in such a manner that a 300-nm-thick $SiO_2$ layer 22 is formed on a p-type semiconductor substrate 21, and an MIM structure having an arrangement of upper electrode 23/insulator film 24/lower electrode 25 is formed thereon. The MIM structure comprises an approximately 30-nm-thick insulator film 24 lying between the upper electrode 23, which is formed of approximately 150-nm-thick platinum, and the lower electrode 25, which is formed of approximately 100-nm-thick platinum. Using this device, the leakage current density in the insulator film was measured while applying 1 V across the upper and lower electrodes 23 and 25. FIG. 3 shows the relationship between the measured leakage current density and elapsed time.

The insulator film used in this embodiment is formed by sputtering, which is described later. Here, four types of sputtering gas were examined, each having a ratio of the flow rate of nitrogen gas $F_N$ to the sum of the flow rate of nitrogen gas $F_N$ and oxygen gas $F_O$ of 0%, 37.5%, 62.5%, and 85.4%, respectively (hereunder, this is referred to as the "ratio of nitrogen flow rate $R_N$ (=$F_N/(F_N+F_O)$)"). As shown in FIG. 3, an insulator film with the ratio of nitrogen flow rate $R_N$ of 37.5% exhibits a leakage current density less than half that of an insulator film with the ratio of nitrogen flow rate $R_N$ of 0%, i.e., an insulator film with no nitrogen added, when measurement starts. The leakage current density decreases with the passage of time, and, after 5 seconds, the leakage current density of the insulator film with the ratio of nitrogen flow rate $R_N$ of 37.5% becomes less than one hundredth that of the insulator film with the ratio of nitrogen flow rate $R_N$ of 0%. However, the leakage current density gradually increases when the ratio of nitrogen flow rate $R_N$ increases to 62.5% and 85.4%. Adding nitrogen greatly decreases the leakage current density; however, when the ratio of nitrogen flow rate $R_N$ exceeds a certain level, the leakage current density increases. Therefore, it can be concluded that adding a greater amount of nitrogen does not necessarily reduce the leakage current density.

Figure 4:
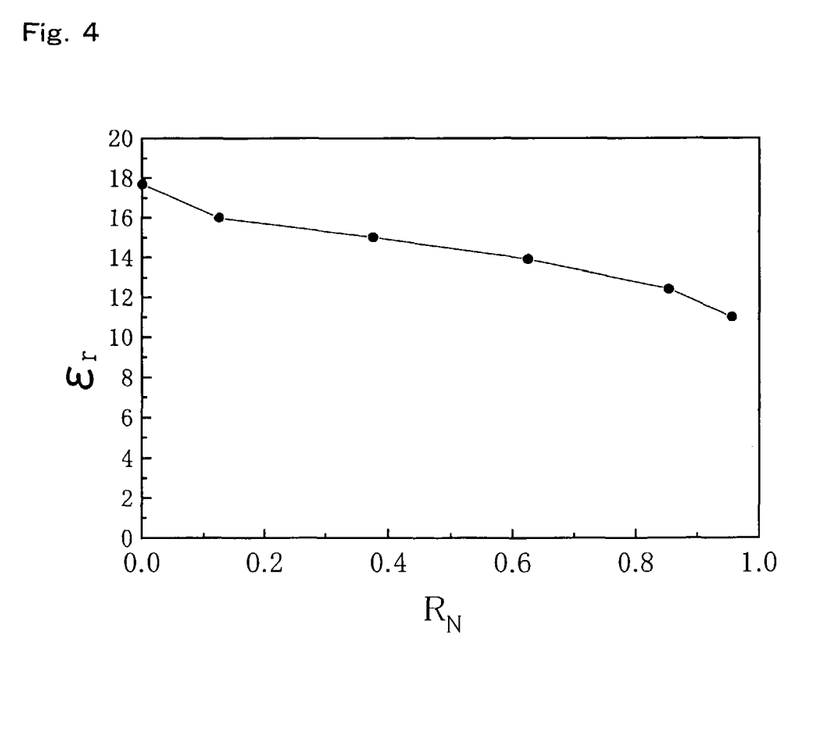
FIG. 4 shows the relationship between the nitrogen flow rate and the dielectric constant.

FIG. 4 shows the relationship between the ratio of nitrogen flow rate $R_N$ and the dielectric constant $\epsilon_r$ of an insulator film obtained by sputtering. According to this figure, when the ratio of nitrogen flow rate $R_N$ increases, i.e., the amount of nitrogen supplied increases, the dielectric constant $\epsilon_r$ of an insulator film decreases. Therefore, the dielectric constant $\epsilon_r$ has to be reviewed to select a desirable amount of nitrogen.

Figure 5:
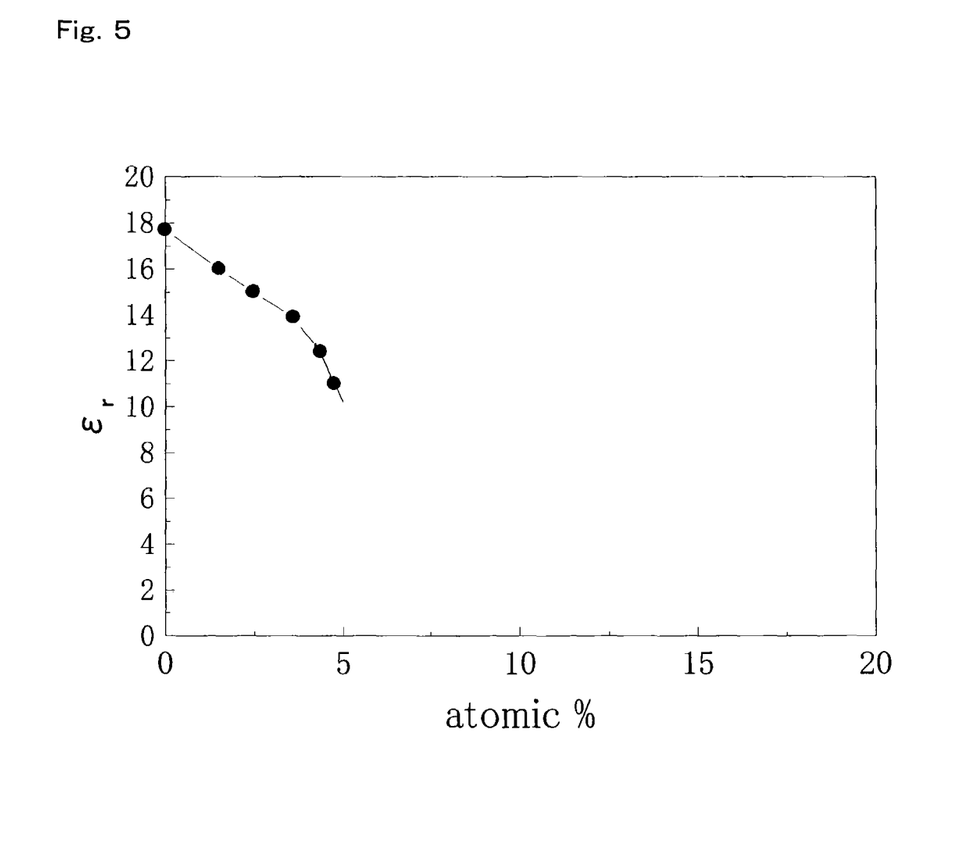
FIG. 5 shows the relationship between the atomic percent of nitrogen and the dielectric constant.

FIG. 5 shows the relationship between the percentage (atomic %) of nitrogen atoms and the dielectric constant $\epsilon_r$. In this embodiment, the atomic percent of nitrogen in an insulator film was measured using an X-ray photoelectron spectroscope (XPS) (manufactured by Physical Electronics, model: ESCAA5400MC) and a secondary ion mass spectrometer (SIMS) (manufactured by ATOMIKA, model: SIMS4500). When the XPS was used, measurement was performed using Al-Ka radiation for the X-ray anode, wherein the output thereof was set at 14 kV and 200 W. Furthermore, when the SIMS was used, measurement was conducted using Cs+ as a primary ion source and negative ions as a secondary ion source, wherein the primary ion energy was set at 2.0 keV.

FIG. 5 shows that when the atomic percent of nitrogen increases, the dielectric constant decreases. As described above, a higher dielectric constant is preferable from the viewpoint of decreasing leakage current. Consequently, considering the fact that, as shown in FIG. 3, leakage current decreases when even a slight amount of nitrogen is contained, and the relationship, as shown in FIG. 5, between the atomic percent of nitrogen and the dielectric constant, it is assumed that the atomic percent of nitrogen in an insulator film is preferably not less than 0.1 and not more than 30.0, more preferably not less than 0.5 and not more than 10.0, and particularly preferably not less than 1.0 and not more than 6.0.

According to a semiconductor device of the present embodiment having such a structure, in the gate electrode structure 15, the intermediate insulator films 153 and 155 that comprise HfO:N or HfON are disposed between both the pairs consisting of the floating gate electrode 152 and the ferroelectric film 154, and the ferroelectric film 154 and the control gate electrode 156, respectively. Thereby, the following effects can be achieved. Semiconductor devices having such a structure conventionally have a problem in that leakage current flows from the control gate electrode 156 into the floating gate electrode 152 via the ferroelectric film 154 and compensates the charge. In this embodiment, since the intermediate insulator films 153 and 155 are disposed as described above, leakage current from the control gate electrode 156 can be reliably prevented. As a result, the retention time can be extended.

Particularly, since the intermediate insulator films 153 and 155 of the present embodiment comprise a nitrogen-containing hafnium oxide, it is possible to significantly reduce the leakage current, further extending the retention time. In addition, because these intermediate insulator films 153 and 155 exhibit a high dielectric constant, it is possible to reduce the voltage that is applied to them, thus enabling the semiconductor device to be driven with low voltage.

Figure 6:
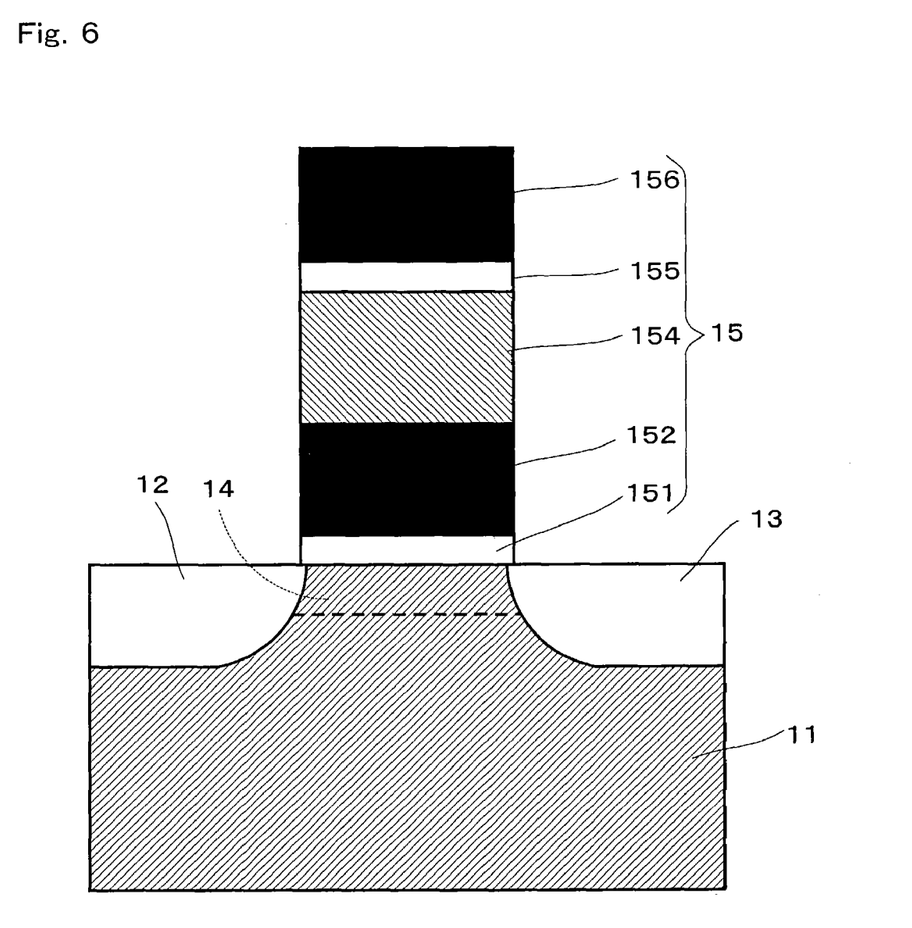
FIG. 6 is a cross-sectional view illustrating another example of the semiconductor device shown in FIG. 1.

In the present embodiment, one each of the intermediate insulator films 153 and 155 is disposed between both of the pairs consisting of the floating gate electrode 152 and the ferroelectric film 154, and the ferroelectric film 154 and the control gate electrode 156; however, it is possible to dispose an intermediate insulator film only between one of the pairs. For example, as shown in FIG. 6, it is also possible to dispose the intermediate insulator film 155 only between the ferroelectric film 154 and the control gate electrode 156.

(2. Method for Fabricating a Semiconductor Device)

Next, a method for fabricating a semiconductor device that has the above-described structure will be explained. Hereunder, film formation methods employing sputtering, the MOCVD method, and the ALD method will be explained in particular detail for forming a gate electrode structure for use in the above-described semiconductor device.

(2-1. Sputtering)

Figure 7:
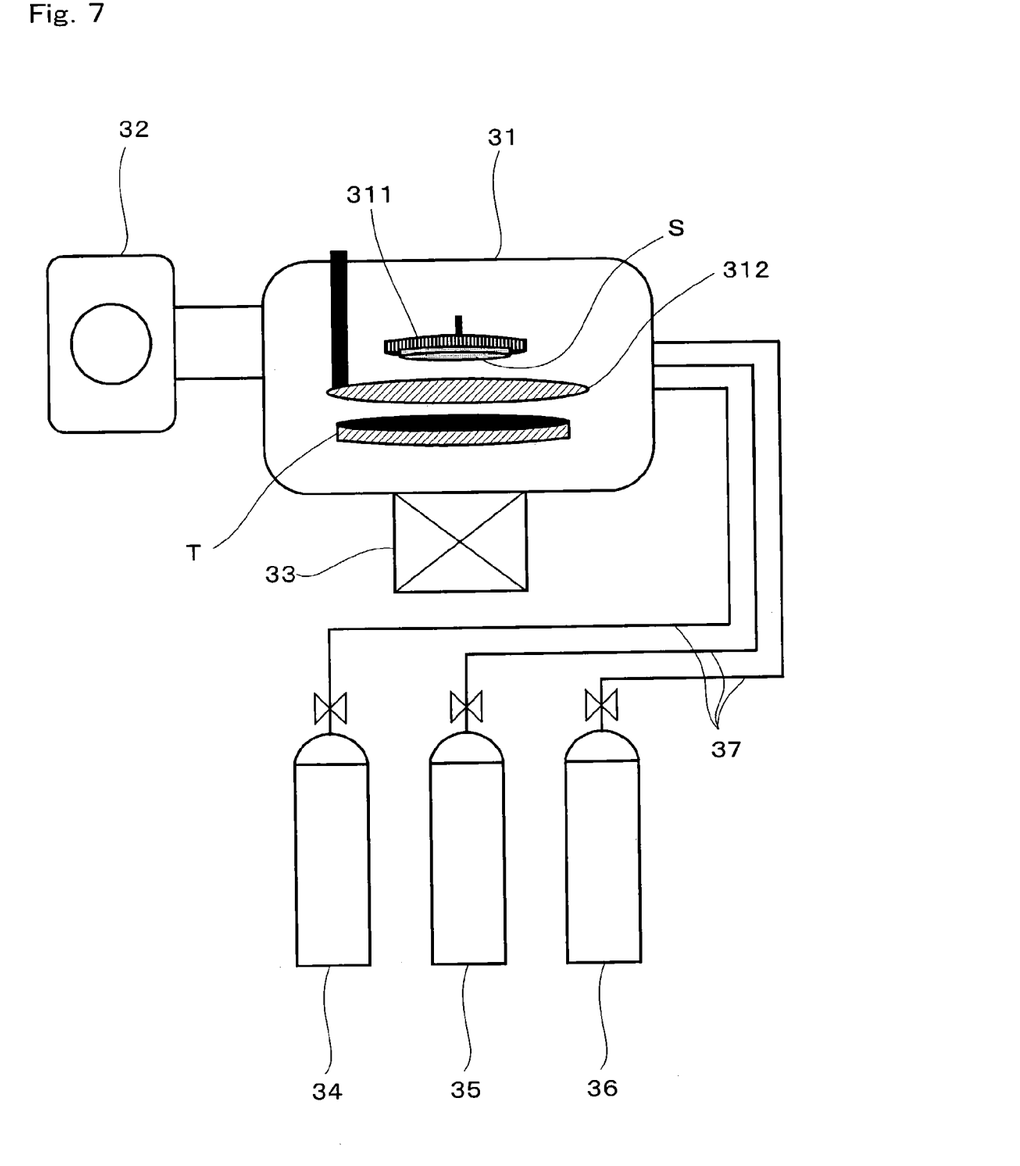
FIG. 7 schematically shows the structure of the sputtering device that is used for forming the films of the semiconductor device shown in FIG. 1.

FIG. 7 schematically shows the structure of a sputtering device. As shown in this figure, this sputtering device comprises a main body 31 in which a semiconductor substrate can be disposed, and a load lock chamber 32 that is connected to the main body 31 via an ultra-high vacuum gate valve (not shown). A vacuum pump 33 that is capable of reducing the internal pressure of the main body 31 to an ultra-high vacuum condition is mounted to the main body 31. The semiconductor substrate S is conveyed to the ultra-high vacuum main body 31 from the outside atmosphere through the load lock chamber 32. Thus, by conveying the semiconductor substrate S via the load lock chamber 32, film can be formed on the semiconductor substrate S without directly opening the inside of the main body 31 to the outside atmosphere. As a result, it is possible to maintain the inside of the main body 31 at a very high degree of vacuum, for example, $1 \times 10^{-10}$ Torr or less for a long time, preventing the inside of the main body 31 and the semiconductor substrate S from contamination.

The main body 31 is provided with a substrate-heating element 311 to heat the back surface of the semiconductor substrate S disposed thereon, and a shutter 312 to insulate a target T from the substrate S. The shutter 312 is removed from between the target T and the substrate S during film formation. While film is not being formed, the shutter 312 lies between the target T and the substrate S to prevent the materials of the target T from being deposited on the substrate S. In this embodiment, Hf metal is used as the target T. Three cylinders, 34, 35, and 36, which contain gases that compose a sputtering gas are connected to the main body 31 via gas-supply lines 37. Cylinders 34, 35, and 36 contain oxygen gas, nitrogen gas, and argon gas, respectively.

Next, a film formation process using the above sputtering device will be explained for the case of forming a gate insulator film. First, after conveying the semiconductor substrate S, which is made of an Si substrate or the like into the main body 31 through the load lock chamber 32, the inside of the main body 31 is slowly evacuated to a sufficient level. Here, it is preferable that the internal pressure be $1 \times 10^{-7}$ Torr or lower. At this time, the substrate S and the target T are isolated from each other by the shutter 312.

Then, the substrate is heated by the substrate-heating element 311. The temperature of the substrate is preferably not lower than 200° C. and not higher than 650° C., and more preferably not lower than 250° C. and not higher than 350° C. Sequentially, the valve of one of the gas-supply lines 37 is opened so as to supply only argon gas into the main body 31. The rate of argon gas flow during film formation depends on the volume of the main body 31 and the pumping speed of the vacuum pump 33; however, preferably, it is not less than 1 sccm and not more than 100 sccm, and, more preferably, not less than 5 sccm and not more than 20 sccm. The total pressure during film formation depends on the volume of the main body 31, the pumping speed of the vacuum pump 33, and the performance of the voltage applying device (not shown); however, preferably, it is not less than 0.1 mTorr and not more than 100 mTorr, and more preferably not less than 1 mTorr and not more than 20 mTorr.

Then, using argon gas as a sputtering gas, plasma is generated in the main body 31. After a predetermined period of time has elapsed, the surface of the target T is cleaned using argon plasma. At this time, the shutter 312 is closed so that the target T will not be deposited on the Si substrate S. The cleaning time depends on the conditions of the target T; however, generally, it is not shorter than 3 minutes and not longer than 60 minutes, and preferably not shorter than 5 minutes and not longer than 30 minutes.

When the cleaning of the target surface is completed, the generation of plasma is stopped, and, in addition to argon gas, oxygen gas and nitrogen gas are introduced into the main body 31. After mixing these three gases, the plasma is turned on again. When the gas flow rate, voltage application, degree of vacuum, and the like in the main body 31 become stabilized, the shutter 312 is opened to deposit a gate insulator film composed of nitrogen-added hafnium oxide onto the substrate S. When a predetermined time has passed and a desirable film thickness is obtained, the shutter 312 is closed and application of a voltage is halted, and then the sputtering gas supply is stopped. It is preferable that the time required to obtain the desired film thickness be calculated beforehand based on a film formation rate that has been previously measured.

When the formation of the gate insulator film is completed, the substrate S is taken out of the main body 31. Thereafter, the floating gate electrode 152, first intermediate insulator film 153, ferroelectric film 154, second intermediate insulator film 155, and control gate electrode 156, which are shown in FIG. 1, are formed using the above sputtering device by following the same manner as in the formation of the gate insulator film. Next, a resist pattern is formed on the control gate electrode 156 by photolithography, and a gate electrode structure 15 is formed by etching. Then, using the gate electrode structure 15 as a mask, the source region 12 and the drain region 13 are formed by a known method, such as an ion-implantation method, etc., followed by annealing as the last process. It is also possible to conduct annealing each time an insulator film is formed. Furthermore, it is also possible to form the source region 12 and the drain region 13 by ion implantation or the like at some stage in the formation of the gate electrode structure 15.

In the annealing process, it is preferable that the annealing temperature be set not lower than 200° C. and not higher than 1,100° C., and, more preferably, not lower than 550° C. and not higher than 750° C. The annealing time depends on the annealing temperature; however, it is preferably not shorter than 5 seconds and not longer than 3,600 seconds. For example, when the annealing temperature is 700° C., it is preferable that the annealing time be set at not shorter than 5 minutes and not longer than 30 minutes. The annealing atmosphere depends on the metal electrode used and the other on-substrate elements; however, for example, when platinum is used as the electrode, the concentration of nitrogen is preferably not lower than 80%, and more preferably 100%.

Figure 8:
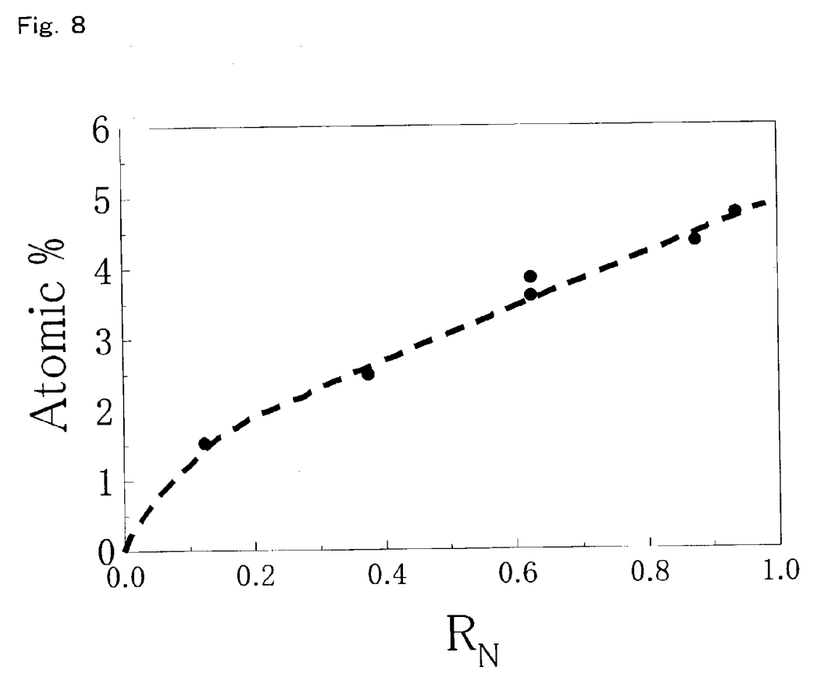
FIG. 8 shows the relationship between the nitrogen flow rate and the nitrogen content of an insulator film.

In order to provide the insulator films with a desirable range of nitrogen atoms, the ratio of the flow rate of the nitrogen gas used as a sputtering gas, i.e., the ratio of nitrogen flow rate $R_N$, must be controlled. Therefore, the relationship between the nitrogen flow rate and the nitrogen content in an insulator film was examined. FIG. 8 shows the results. As is clear from the figure, the nitrogen content increases when the ratio of the nitrogen flow rate $R_N$ increases. Furthermore, even when the ratio of the nitrogen flow rate $R_N$ increases, the content of nitrogen remains in the range of a desirable atomic percent as defined above. Therefore, considering the amount of oxygen gas for oxidizing hafnium, it is preferable that the ratio of the nitrogen flow rate $R_N$ during sputtering be not less than 0.05 and not more than 0.90, and, more preferably, not less than 0.1 and not more than 0.4. Note that while argon gas contributes to the deposition of Hf on the substrate, it does not affect oxygen or nitrogen, and therefore it is not necessary to take the flow rate of argon gas into consideration.

The sputtering of the present invention is not limited to the above, and various modifications can be made. For example, in the above explanation, Hf metal was used as a target; however, it is also possible to use $HfO_2$ and like Hf compounds. Alternatively, the ferroelectric film can also be formed by a method different from sputtering, such as, for example, a sol-gel process or MOCVD.

(2-2. MOCVD Method)

Figure 9:
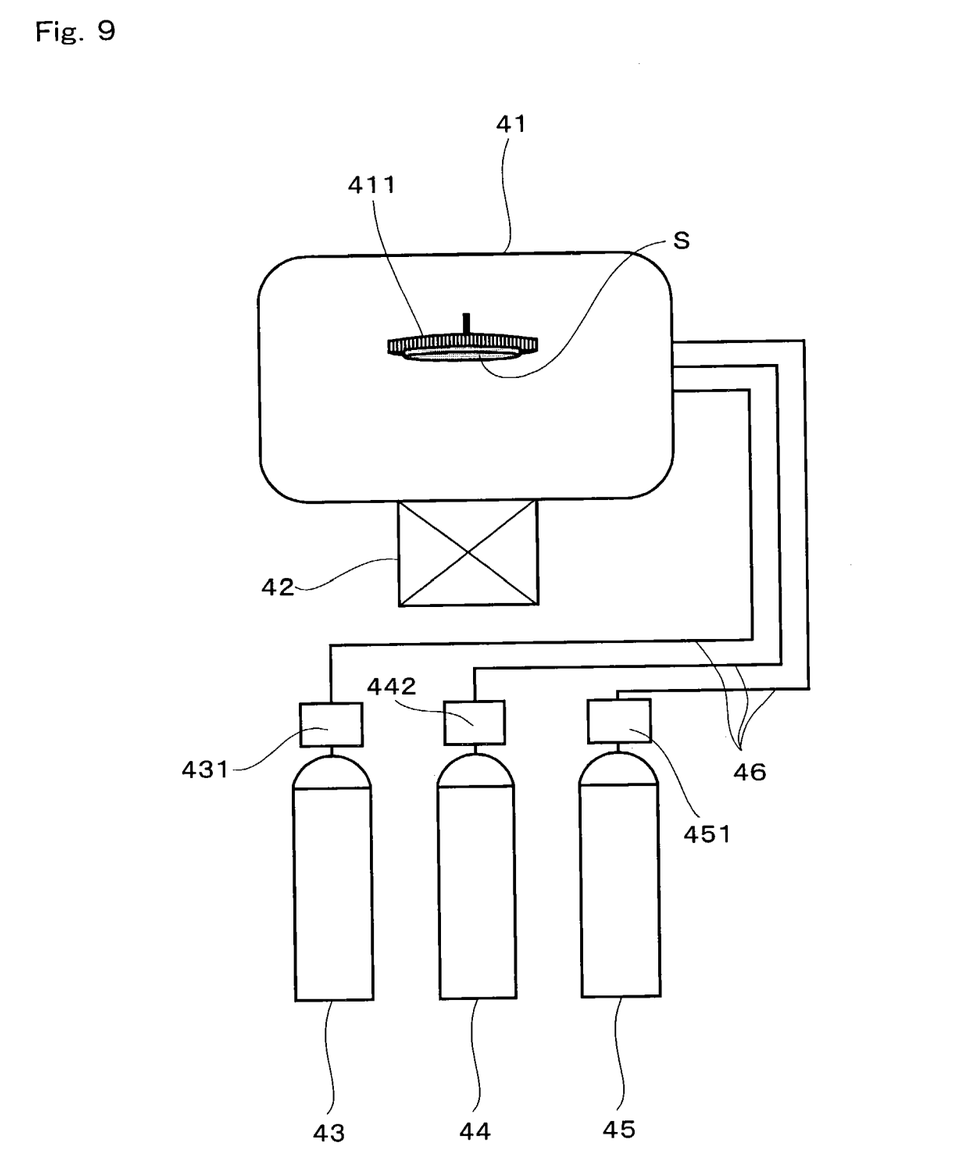
FIG. 9 is a diagram showing the schematic structure of an MOCVD device that is used for film formation in the semiconductor device shown in FIG. 1.

Hereunder, a method for forming an insulator film by MOCVD (metal organic chemical vapor deposition) will be explained, concentrating mainly on a method for forming a gate insulator film. FIG. 9 shows the schematic structure of an MOCVD device that is used in this method. As shown in this figure, this device comprises a main body 41 to which a semiconductor substrate can be mounted, and the device is structured so that the back surface of the semiconductor substrate S disposed in the main body 41 is heated by a substrate-heating element 411. The main body 41 is provided with a vacuum pump that can reduce the internal pressure of the main body 41 to an ultra-high vacuum condition, and three cylinders 43, 44, and 45 that contain the source gases for MOCVD. The cylinders 43, 44, and 45 are connected to the main body 41 via gas supplying lines 46, and contain tertiary-butoxy hafnium ($Hf(O-t-C_4H_9)_4$) gas, oxygen gas, and nitrogen gas, respectively. It is also possible to contain these gases in the cylinders 43, 44, and 45 in a liquid state. For use in a liquid state, pumps 431, 441, and 451 are mounted on the cylinders 43, 44, and 45, respectively, to supply each liquid to the main body 41. Note that, when the materials are in a liquid state, they are supplied to the main body 41 after first being vaporized.

Next, a film formation method using the above MOCVD device will be explained. First, after placing a semiconductor substrate S, which is an Si substrate or the like, in the main body 41, the main body 41 is evacuated over a sufficient period of time. It is preferable, at this time, that the pressure be set at $1 \times 10^{-5}$ Torr or lower. Then, the Si substrate S is heated by turning on the substrate-heating element 411. In this case, it is preferable that the heating be conducted in such a manner that the temperature of the substrate becomes not lower than 200° C. and not higher than 750° C., and more preferably, not lower than 250° C. and not higher than 350° C.

Then, film formation is started by introducing tertiary-butoxy hafnium gas, oxygen gas, and nitrogen gas into the main body 41. The flow rate of the mixed gas depends on the volume of the main body 41 and the pumping speed of the vacuum pump 42; however, it is preferably not less than 1 sccm and not more than 100 sccm, and, more preferably, not less than 5 sccm and not more than 20 sccm. The total pressure during film formation depends on the volume of the main body 41, the pumping speed of the vacuum pump, and the performance of the voltage applying device (not shown); however, it is preferably not less than 0.1 mTorr and not more than 500 mTorr, and, more preferably, not less than 10 mTorr and not more than 200 mTorr.

When a predetermined time period has passed and a desirable film thickness is obtained, film formation is completed by stopping the supply of the gas. It is preferable that the duration of time until a desirable film thickness is obtained be calculated beforehand based on a film formation rate that has been previously measured.

When film formation is completed, the substrate S is taken out of the main body 41, and the same process as that when film formation is conducted by sputtering is conducted, i.e., a floating gate electrode 152, a first intermediate insulator film 153, a ferroelectric film 154, a second intermediate insulator film 155, and a control gate electrode 156 are formed followed by the formation of a source region 12 and a drain region 13. Similar to the gate insulator film 151, the intermediate insulator films 153 and 155 can be formed by using an MOCVD device. Then, annealing is conducted in the same manner as that when film formation is conducted by sputtering. Annealing can be performed under the same conditions as in the sputtering described above.

In the above-explained film formation process, the ratio of the flow rates of tertiary-butoxy hafnium, oxygen gas, and nitrogen gas is an important parameter, which strongly affects the electrical characteristics of the resulting insulator film. Particularly, the ratio between the flow rates of oxygen gas and nitrogen gas, i.e., the ratio of the nitrogen flow rate $R_N$, is very important, because it determines the amount of nitrogen added to the hafnium oxide. The preferable range of the ratio of the nitrogen flow rate $R_N$ is not less than 0.05 and not more than 0.90, and, more preferably, not less than 0.1 and not more than 0.4.

An example of a method for forming an insulator film of a semiconductor device by MOCVD was explained above; however, the MOCVD of the present invention is not limited to this and various modifications can be made. For example, in the above explanation, tertiary-butoxy hafnium gas was used to supply hafnium to an insulator film; however, the usable gas is not limited to this and other gases can be used as long as they are hafnium-containing organic metal compounds. For example, isopropoxy hafnium (Hf(O-i-$C_3H_7$)$_4$), hafnium-containing DPM complex (tetrakis dipivaloyl methanate hafnium) (Hf($C_{11}H_{19}O_2$)$_4$), isopropoxy-hafnium-containing DPM complex (Hf(O-i-$C_3H_7$)$_2$($C_{11}H_{19}O_2$)$_2$), and tetramethyl hafnium (Hf($CH_4$)$_4$) can be used.

Other than oxygen gas, gases that contain oxygen atoms, such as water vapor ($H_2O$ gas) can be used. Furthermore, other than nitrogen gas, gases that contain nitrogen atoms, such as nitrous oxide ($N_2O$), nitrogen monoxide (NO), hydrazine ($N_2H_4$), diisopropyl amine (i-$C_3H_7$)$_2$NH, tertiary butylamine ((t-Ch$H_9$)N$H_2$), ammonia (N$H_3$), and trimethyl ammonium (N(C$H_3$)$_3$) can be used.

(2-3. ALD Method)

Next, a method for forming an insulator film using ALD (atomic layer deposition) will be explained. The film formation apparatus used in ALD is almost the same as that shown in FIG. 9. Therefore, the explanation will be given by referring to the apparatus shown in FIG. 9, using the same symbols for the same components, and a detailed explanation will be omitted. The ALD method is quite different from the MOCVD method in the kinds of gases to be supplied to the main body 41 and the sequence of gas supply thereof. These differences lead to differences in the film formation rate and in the flatness of the resulting films. Examples of usable materials include hafnium tetrachloride (HfCl$_4$), water (H$_2$O), and hydrazine (N$_2$H$_4$), and these materials are supplied to the main body 41 in a gas state. These materials can be contained in cylinders 43, 44, and 45 in a gas or liquid state. Note that, when these gases are used in a liquid state, they should be heated to form a gas state beforehand and then supplied to the main body 41. In addition to these cylinders, a cylinder that accommodates nitrogen gas as a purge gas is connected to the main body.

Next, a film formation process will be explained. First, after placing an Si substrate S in the main body 41, the internal pressure of the main body 41 is reduced over a sufficient period of time. It is preferable that the pressure thereof be reduced to $1 \times 10^{-5}$ Torr or less. Then, the Si substrate S is heated by turning on a substrate-heating element 411. In this case, it is preferable that the heating be conducted in such a manner that the temperature of the substrate becomes not lower than 20° C. and not higher than 550° C., and, more preferably, not lower than 30° C. and not higher than 300° C.

Figure 10:
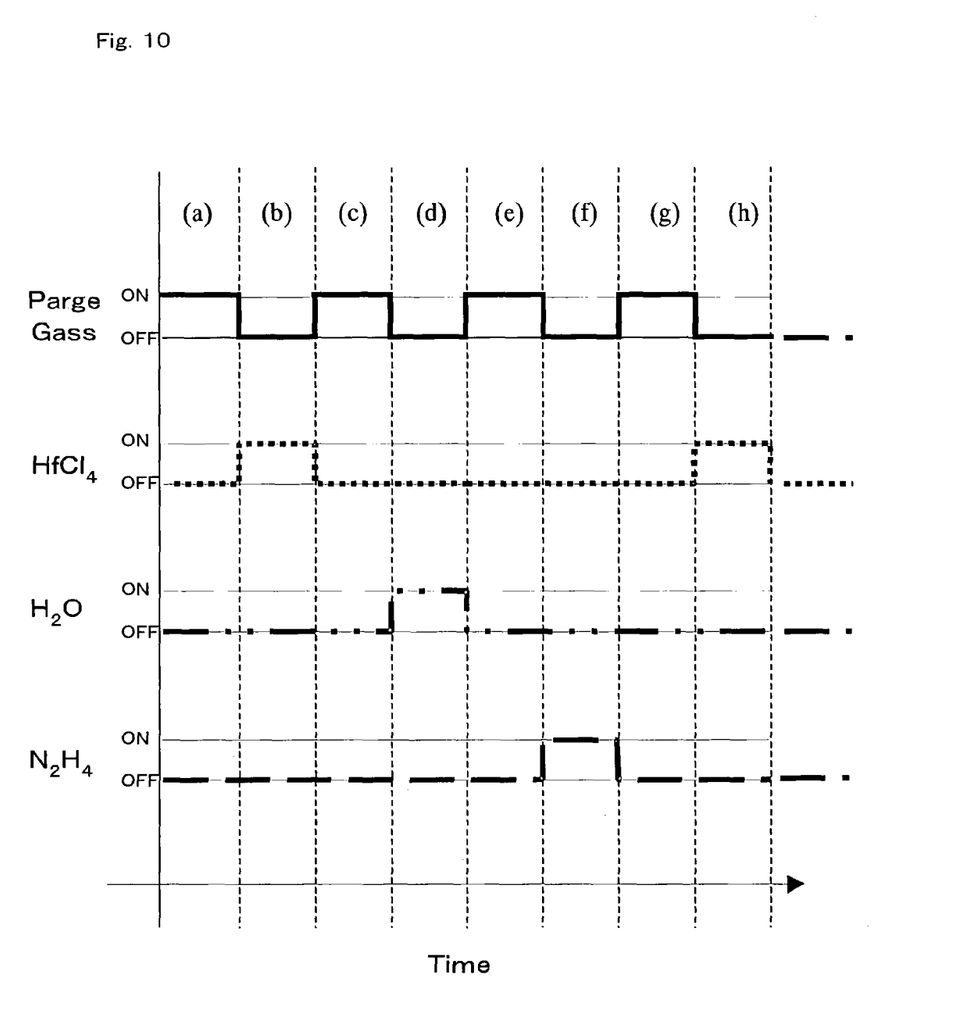
FIG. 10 is a timing chart showing the timing for introducing each of the source gases when the films of the semiconductor device shown in FIG. 1 are fabricated by ALD.

Then, according to the timing chart shown in FIG. 10, gases are supplied to the main body 41 one by one. First, nitrogen, which serves as a purge gas, is supplied to the main body 41 to remove excess elements from the surface of the Si substrate S (stage (a)). Next, the supply of the purge gas is stopped and film formation is started by supplying HfCl$_4$ to the main body 41 (stage (b)). Then, the supply of HfCl$_4$ is stopped and purge gas is supplied to the main body 41 (stage (c)). The purge gas removes any excess HfCl$_4$ that has been absorbed by the surface of the substrate and that makes the surface coverage greater than 1. Thereafter, the supply of the purge gas is stopped and the supply of H$_2$O is started (stage (d)). Thereby, the HfCl$_4$ that has been absorbed by the substrate reacts with H$_2$O to form an HfO$_2$ film. At the same time, HCl is eliminated therefrom.

The supply of H$_2$O is then stopped and the supply of the purge gas is restarted to remove any excess H$_2$O that was absorbed by the substrate S (stage (e)). Next, supply of the purge gas is stopped and hydrazine is supplied to the main body 41 so that the hydrazine is absorbed by the substrate. The heat of the substrate S decomposes the hydrazine, and the resulting nitrogen is incorporated into the surface of the HfO$_2$ (stage (f)). Then, the supply of the hydrazine gas is stopped and the supply of the purge gas is started. Thereby, it is possible to remove excess hydrazine that was absorbed by the substrate S (stage (g)). Note that, as described later, stage (h) is the initial step of the next cycle and is the same as stage (b).

The sequential flow of the above-described stages (a) to (g) composes one cycle of the film formation. By following this cycle, it is possible to deposit a monomolecular layer of HfO$_2$ having nitrogen supplied therein. By repeating this cycle, it is possible to obtain a thicker HfO$_2$ film. In this case, film formation is completed in the same manner as in the above-described fabrication method. That is, the number of cycles that is necessary to obtain a predetermined film thickness is determined based on a film formation rate that has been measured in advance, and, after repeating the determined number of cycles, the supply of gas is stopped and film formation is completed.

The flow rate of the gas during film formation depends on the volume of the main body 41 and the pumping speed of the vacuum pump 42; however, it is preferably not less than 1 sccm and not more than 100 sccm, and, more preferably, not less than 5 sccm and not more than 20 sccm. The total pressure during film formation depends on the volume of the main body 41, the pumping speed of the vacuum pump 42, and the performance of the voltage applying device; however, it is preferably not less than 0.1 mTorr and not more than 500 mTorr, and, more preferably, not less than 10 mTorr and not more than 200 mTorr.

When film formation is completed, the substrate is removed from the main body. Next, as in the method described above, a floating gate electrode, a first intermediate insulator film, a ferroelectric film, a second intermediate insulator film, and a control gate electrode are formed, and then a source region and a drain region are formed. Similar to the gate insulator film, each intermediate insulator film is formed using the above-described ALD apparatus. Then, annealing is conducted in the same manner as when film formation is conducted by sputtering. Annealing can be performed under the same conditions as in the sputtering described above.

In the ALD method, the flow rate of hydrazine gas $F_H$ that supplies nitrogen to an insulator film is important, and the ratio of the flow rate of hydrazine gas to the sum of the flow rate of $H_2O$ gas $F_{H2O}$ and hydrazine gas, i.e., the proportion of the flow rate of hydrazine $R_H$ (=$F_H/(F_H+F_{H2O})$), becomes an important parameter. The desirable range of the proportion of the flow rate of hydrazine $R_H$ is not less than 0.05 and not more than 0.90, and, more preferably, in the range not less than 0.1 and not more than 0.4. Note that the flow rate of hydrazine $F_H$ is the flow rate of hydrazine that is supplied in stage (f), and the flow rate of $H_2O$ gas $F_{H2O}$ is the flow rate of $H_2O$ gas that is supplied in stage (d).

An example of a method for forming an insulator film of a semiconductor device by ALD was explained above; however, the ALD of the present invention is not limited to this and various modifications can be made. For example, in the above explanation, nitrogen gas was used as the purge gas; however, other gases can be used as long as they are inert, such as argon gas, neon gas, etc.

Furthermore, in the above explanation, hydrazine was used to supply nitrogen to an insulator film; however, other gases can be used as long as they contain nitrogen atoms. Examples of usable gases include nitrogen gas ($N_2$), nitrous oxide ($N_2O$), nitrogen monoxide (NO), ammonia ($NH_3$), and trimethyl ammonium ($N(CH_3)_3$). These can be used singly or in a combination of two or more.

INDUSTRIAL APPLICABILITY

The present invention provides a semiconductor device, wherein the amount of leakage current can be reduced by employing an MIFIMIS structure in which an insulator film is provided in an MFMIS structure, or the like, and a fabrication method thereof. This semiconductor device provides a switching element with a reduced amount of leakage current.

The invention claimed is:

1. A semiconductor device comprising:
   a semiconductor substrate;
   a source region and a drain region, which are formed on the semiconductor substrate with a channel region therebetween;
   a floating gate electrode that is formed on the channel region with a gate insulator film therebetween;
   a ferroelectric film that is formed on the floating gate electrode; and
   a control gate electrode that is formed on the ferroelectric film;
   wherein an intermediate insulator film is formed between at least one of the pairs consisting of the floating gate electrode and the ferroelectric film, and the ferroelectric film and the control gate electrode; and
   the intermediate insulator film is made of a hafnium oxide that contains nitrogen atoms.

2. The semiconductor device according to claim 1, wherein intermediate insulator films are formed both between the floating gate electrode and the ferroelectric film, and between the ferroelectric film and the control gate electrode.

3. The semiconductor device according to claim 1, wherein the gate insulator film is made of hafnium oxide that contains nitrogen atoms.

4. The semiconductor device according to claim 1, wherein the intermediate insulator film contains nitrogen atoms of not less than 0.1 atomic % and not more than 30.0 atomic %.

5. The semiconductor device according to claim 1, wherein the intermediate insulator film contains nitrogen atoms of not less than 0.5 atomic % and not more than 10.0 atomic %.

6. The semiconductor device according to claim 1, wherein the intermediate insulator film contains nitrogen atoms of not less than 1.0 atomic % and not more than 6.0 atomic %.

7. The semiconductor device according to claim 1, wherein the floating gate electrode comprises silicon or metal.

8. The semiconductor device according to claim 1, wherein the ferroelectric film comprises silicon or metal.

* * * * *

UNITED STATES PATENT AND TRADEMARK OFFICE
CERTIFICATE OF CORRECTION

PATENT NO. : 7,135,736 B2 Page 1 of 1
APPLICATION NO. : 10/616917
DATED : November 14, 2006
INVENTOR(S) : Takashi Nishikawa et al.

It is certified that error appears in the above-identified patent and that said Letters Patent is hereby corrected as shown below:

On the title page of the Letters Patent,

Under section "(56) References Cited, FOREIGN PATENT DOCUMENTS", delete " JP 11-168096 6/1999 "

Signed and Sealed this

Fourth Day of September, 2007

JON W. DUDAS
*Director of the United States Patent and Trademark Office*